United States Patent
Drowley et al.

(10) Patent No.: US 12,224,344 B2
(45) Date of Patent: Feb. 11, 2025

(54) METHOD AND SYSTEM FOR CONTROL OF SIDEWALL ORIENTATION IN VERTICAL GALLIUM NITRIDE FIELD EFFECT TRANSISTORS

(71) Applicant: SEMICONDUCTOR COMPONENTS INDUSTRIES, LLC, Scottsdale, AZ (US)

(72) Inventors: Clifford Drowley, Santa Clara, CA (US); Andrew P. Edwards, Santa Clara, CA (US); Hao Cui, Santa Clara, CA (US); Subhash Srinivas Pidaparthi, Santa Clara, CA (US); Michael Craven, Santa Clara, CA (US); David DeMuynck, Santa Clara, CA (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 450 days.

(21) Appl. No.: 17/707,835

(22) Filed: Mar. 29, 2022

(65) Prior Publication Data

US 2022/0328688 A1    Oct. 13, 2022

Related U.S. Application Data

(60) Provisional application No. 63/172,525, filed on Apr. 8, 2021.

(51) Int. Cl.
*H01L 29/78* (2006.01)
*H01L 29/20* (2006.01)
*H01L 29/423* (2006.01)
*H01L 29/66* (2006.01)

(52) U.S. Cl.
CPC ...... *H01L 29/7827* (2013.01); *H01L 29/2003* (2013.01); *H01L 29/42384* (2013.01); *H01L 29/66446* (2013.01)

(58) Field of Classification Search
CPC ............ H01L 29/7827; H01L 29/2003; H01L 29/42384; H01L 29/66446
See application file for complete search history.

(56) References Cited

U.S. PATENT DOCUMENTS

| | | | |
|---|---|---|---|
| 11,374,106 B2 * | 6/2022 | Brueck | H01L 21/02639 |
| 11,662,374 B2 * | 5/2023 | Goto | G01R 31/2656 |
| | | | 324/762.01 |
| 2006/0205199 A1 * | 9/2006 | Baker | H01L 21/02658 |
| | | | 438/606 |
| 2007/0221932 A1 * | 9/2007 | Kano | H01S 5/34333 |
| | | | 257/96 |
| 2009/0081857 A1 * | 3/2009 | Hanser | C30B 29/406 |
| | | | 257/E21.108 |
| 2009/0236694 A1 * | 9/2009 | Mizuhara | H01L 21/02658 |
| | | | 438/492 |

(Continued)

*Primary Examiner* — Eugene Lee
(74) *Attorney, Agent, or Firm* — Kevin B. Jackson

(57) ABSTRACT

A III-N-based vertical transistor includes a III-N substrate, a source, a drain, and a channel comprising a III-N crystal material and extending between the source and the drain. The channel includes at least one sidewall surface aligned ±0.3° with respect to an m-plane of the III-N crystal material. The III-N-based vertical transistor also includes a gate electrically coupled to the at least one sidewall surface of the channel.

14 Claims, 6 Drawing Sheets

(56) References Cited

U.S. PATENT DOCUMENTS

| | | | |
|---|---|---|---|
| 2011/0068434 A1* | 3/2011 | Yamaguchi | H01L 21/02021 83/13 |
| 2013/0134434 A1* | 5/2013 | Mikami | H01L 29/2003 257/E29.089 |
| 2017/0362739 A1* | 12/2017 | Kajimoto | C30B 25/20 |
| 2019/0312111 A1* | 10/2019 | Nagao | H01L 21/0254 |
| 2022/0173102 A1* | 6/2022 | Passlack | H01L 29/518 |
| 2024/0276698 A1* | 8/2024 | Ghani | H01L 21/823842 |

\* cited by examiner

METHOD AND SYSTEM FOR CONTROL OF SIDEWALL ORIENTATION IN VERTICAL GALLIUM NITRIDE FIELD EFFECT TRANSISTORS

CROSS-REFERENCES TO RELATED APPLICATIONS

This application claims priority to U.S. Provisional Patent Application No. 63/172,525, filed on Apr. 8, 2021, the disclosure of which is hereby incorporated by reference in its entirety for all purposes.

BACKGROUND OF THE INVENTION

Vertical power transistors, in which current flows predominantly from the top surface of the transistor to the back or bottom surface of the transistor substrate, are commonly used for controlling high currents and high voltages, since they can be formed with a reduced area compared to devices in which current flow through the transistor is lateral.

III-nitride materials, and in particular, gallium nitride (GaN), allow vertical FET-based power transistors to be fabricated with high breakdown voltages (e.g., in excess of 1200 V) while offering significant reductions in the specific on-resistance (i.e., the on-resistance of the device multiplied by the device area) compared to silicon or silicon carbide materials.

Despite the progress made in the area of vertical power transistors, there is a need in the art for improved methods and systems related to vertical power transistors.

SUMMARY OF THE INVENTION

The present invention generally relates to the field of electronics, and more specifically to devices and methods for implementing sidewall orientation control during the fabrication of field effect transistor (FET) gate-to-channel interfaces used to control current flow in the channel region of a vertical FET, for example, a vertical power FET fabricated using III-nitride materials. Embodiments of the present invention are applicable to a variety of different, vertical FET structures and gate configurations.

In an embodiment, a vertical FET on a III-nitride substrate is provided in which the gate interface of the vertical FET is disposed on a plane perpendicular to the c-plane of the III-nitride substrate. The direction vector lying in the surface of the gate interface and parallel to the c-plane is one of < $\overline{1}2\overline{1}0$ >±0.3°; for example, the direction vector lying in the surface of the gate interface and parallel to the c-plane can be one of < $\overline{1}2\overline{1}0$ >±0.15°.

According to an embodiment of the present invention, a III-N-based vertical transistor is provided. The III-N-based vertical transistor includes a III-N substrate, a source, a drain, and a channel comprising a III-N crystal material and extending between the source and the drain. The channel includes at least one sidewall surface aligned ±0.3° with respect to an m-plane of the III-N crystal material. The III-N-based vertical transistor also includes a gate electrically coupled to the at least one sidewall surface of the channel.

According to another embodiment of the present invention, a fin-based field effect transistor (FinFET) is provided. The FinFET includes a gallium nitride (GaN) substrate or epitaxy wafer and a plurality of fins, each of the plurality of fins defining a channel extending between a source and a drain. Sidewall surfaces of each of the plurality of fins are aligned ±0.3° with respect to an m-plane of the GaN substrate. The FinFET also includes a set of gates electrically coupled to the sidewall surfaces of each of the plurality of fins.

According to a specific embodiment of the present invention, a method of fabricating a field effect transistor (FET) on a III-nitride substrate is provided. The method includes providing the III-nitride substrate or epitaxy wafer, aligning a mask with respect to the III-nitride substrate or epitaxy wafer, and forming a masking layer, also referred to as a mask layer, including a plurality of mask patterns. The method also includes patterning a plurality of gate regions using the plurality of mask patterns to form a plurality of gate interface regions aligned parallel to one of the < $\overline{1}2\overline{1}0$ > directions of the III-nitride substrate ±0.3° and forming a plurality of gate regions in contact with the plurality of gate interface regions. The method further includes forming a set of gate electrodes, forming a source electrode, and forming a drain electrode.

Numerous benefits are achieved by way of the present disclosure over conventional techniques. For example, embodiments of the present disclosure provide methods and systems for aligning device structures with the crystallographic planes of the semiconductor material. In a particular example, the sidewalls of a vertical FinFET are fabricated so that they are parallel to the m-plane of a GaN substrate ±0.3°. This control of the sidewall orientation, which can be referred to as sidewall lateral orientation, provides a high level of control over the threshold voltage of the vertical FinFET device. These and other embodiments of the disclosure, along with many of its advantages and features, are described in more detail in conjunction with the text below and corresponding figures.

DETAILED DESCRIPTION OF THE INVENTION

Figure 1A:
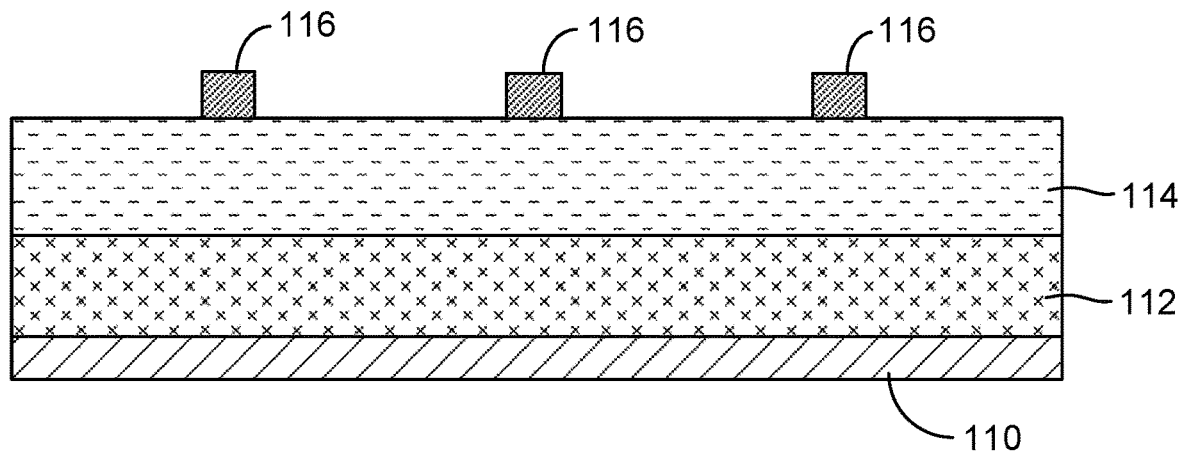
FIG. 1A is a simplified cross-sectional diagram illustrating a substrate structure at a first stage of fabrication according to an embodiment of the present invention.

The present invention generally relates to the field of electronics, and more specifically to devices and methods for implementing sidewall orientation control during the fabrication of field effect transistor (FET) gate-to-channel interfaces used to control current flow in the channel region of a vertical FET, for example, a vertical power FET fabricated using III-nitride materials. Embodiments of the present invention are applicable to a variety of different, vertical FET structures and gate configurations.

The manufacturing control of the electrical characteristics of field-effect transistors (FETs), including FET-based power transistors, is central to mass production of such power transistors. In the case of FET power transistors, one of the key electrical characteristics is the threshold voltage of the device, which determines the gate voltage required to initiate significant conduction in the transistor. Precise control of the threshold voltage is essential for circuits (e.g., switching power supplies) designed to incorporate the power transistor.

As described herein, based on electrical analysis of fabricated gallium-nitride-based (GaN-based) vertical transistors, the inventors have determined that the threshold voltage for the transistors, for example, GaN-based vertical transistors including fin-based field effect transistor (FinFET) devices, is a function of misorientation of the sidewall of the FinFET with respect to the m-plane of the GaN crystal. Thus, the orientation of the channel surface, which is defined by the sidewall of the fin, with respect to the crystal planes of the GaN crystal, has a significant effect on threshold voltage. Accordingly, embodiments of the present invention implement methods and systems to control of the orientation of the sidewall relative to the crystallographic directions/planes of the GaN crystal in order to achieve a desired control over the electrical device characteristics during manufacturing of GaN-based, vertical FET power transistors.

As described more fully herein, shifts in the threshold voltage of approximately 0.3V/0.1° of misorientation of the sidewall of the transistor with respect to the m-plane of the GaN crystal have been measured. As a result, some embodiments of the present invention enable the design and fabrication of vertical transistors, particularly FinFETs in which the sidewalls of the fins are aligned within 0.3° (more specifically within 0.15°) with respect to the m-plane of the GaN crystal.

Without limiting embodiments of the present invention, the inventors believe that this impact on threshold voltage resulting from misorientation or non-parallelism between the sidewalls of the fins and the m-plane of the GaN crystal may result from the presence of added charge at the misoriented sidewalls; dangling bonds present at "ledges" that form during etching using a misaligned mask, which can result in fixed charge at the surface; variation in adsorbed impurities present at these "ledges;" variation in surface strain due to the presence of the ledges; variation in interfacial quality between the regrown gate and the sidewall; or non-uniform dopant incorporation into or activation of dopants in the gate of the transistor structure. As an example, the inventors have determined the dopant incorporation can vary on different growth planes, e.g. m-plane vs. c-plane. Thus, as the growth plane is misoriented from the m-plane (e.g., by fractions of a degree), the effective sidewall doping decreases. Embodiments of the present invention are not reliant on a particular source of the variation in threshold voltage and embodiments of the present invention improve device performance, particularly providing consistent and high threshold voltages, independent of the particular source of the variation.

Although the discussion provided in this application is largely devoted to the impact of sidewall misorientation in the context of FinFET devices, the methods and systems described herein are applicable to a variety of electronic devices, including other types of transistors. As an example, for FETs such as metal-oxide-semiconductor FETs (MOSFETs), metal-semiconductor FETs (MESFETs), and the like, where sidewalls are utilized in the device structure, misalignment of the sidewall with respect to the crystal planes of the semiconductor material can result in a shift in threshold voltage. It should be appreciated that embodiments of the present invention are not limited in their application only to fin-based FETs, but can also be applied to other electronic device designs including trench MOSFETs. One of ordinary skill in the art would recognize many variations, modifications, and alternatives.

Thus, embodiments of the present invention are applicable to a variety of vertical FET devices in III-nitride materials. These vertical FET devices include fin-based junction-gate FET (JFET) structures with epitaxially regrown gates, fin-based JFET structures with implanted or diffused gates, fin-based MOSFETs, trench-based MOSFETs, and fin-based or trench-based MESFETs. As will be evident to one of skill in the art, all of these devices include an etched feature that defines the channel of the device extending in a vertical direction along a sidewall of the etched feature as a common structural feature.

As described more fully in relation to FIGS. 1A-1D, GaN-based vertical FET power transistors can be fabricated using structures in which the gate-to-channel interface is aligned with the [0001] direction. These structures can be fabricated by anisotropic etching of the GaN (e.g., by using an etchant such as tri-methyl ammonium hydroxide (TMAH)), which produces surfaces (e.g., surfaces aligned with the GaN m-plane) that are parallel to the [0001] direction (the GaN c-direction) and perpendicular to the (0001) plane (the GaN c-plane). As discussed above, although some of the description provided herein relates to fin-based JFETs, in which, for example, the gate region may be implanted or diffused into the structure, or regrown in contact with the channel surface, various FET devices can be fabricated that include a gate-to-channel interface aligned with the [0001] direction, including MOSFETs, in which a dielectric is placed between the gate electrode and the channel surface, HEMTS, MESFETs, in which the gate is a metal or metal alloy in contact with the channel surface, and other suitable FETs. One of ordinary skill in the art would recognize many variations, modifications, and alternatives.

FIG. 1A is a simplified cross-sectional diagram illustrating a substrate structure at a first stage of fabrication according to an embodiment of the present invention. As illustrated in FIG. 1A, a substrate 110, which can be a III-N substrate, for example, a GaN substrate, supports a first epitaxial layer 112 and a second epitaxial layer 114. In some implementations, first epitaxial layer 112 is a drift layer and second epitaxial layer 114 is used to form the channel region of a vertical FinFET. A mask layer including a plurality of mask patterns 116 is formed on the surface of second epitaxial layer 114. As will be described more fully below, the mask edge extending into the plane of the figure will be aligned with one of the <1̄21̄0> directions of the substrate 110.

Figure 1B:
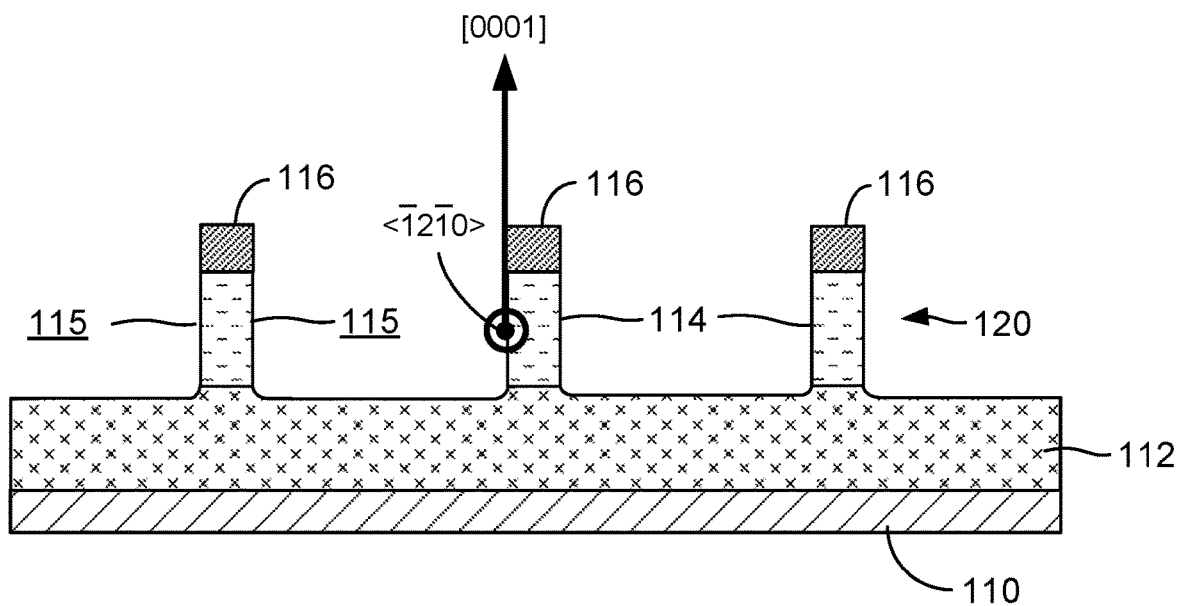
FIG. 1B is a simplified cross-sectional diagram illustrating the substrate structure shown in FIG. 1A at a second stage of fabrication according to an embodiment of the present invention.

FIG. 1B is a simplified cross-sectional diagram illustrating the substrate structure shown in FIG. 1A at a second stage of fabrication according to an embodiment of the present invention. At this stage of the process, an etching process has been used to form a set of fins 120 in second epitaxial layer 114. As an example, a reactive-ion etch (ME) process may be used, followed by an anisotropic wet etch using a hydroxide-based etchant (for example, TMAH) to form sidewall surfaces 115 that are vertically parallel to the [0001] direction (the c-direction). Thus, sidewall surfaces will be a) aligned with the [1̄21̄0] direction extending horizontally into the plane of the figure and parallel to the normal to the figure and b) vertically parallel to the direction (i.e., the c-direction). The crystallographic plane defined by these directions is the m-plane of a GaN substrate.

Figure 1C:
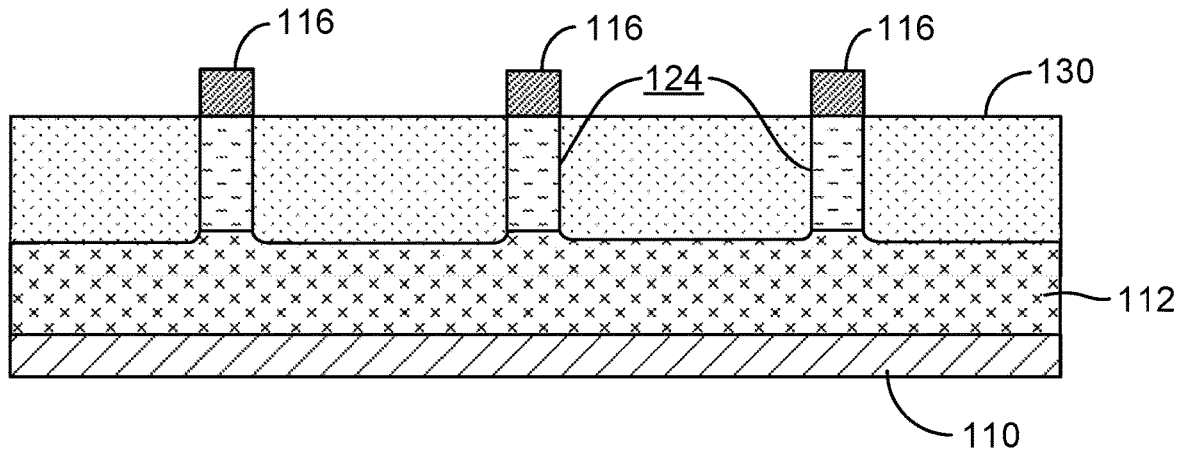
FIG. 1C is a simplified cross-sectional diagram illustrating the substrate structure shown in FIG. 1A at a third stage of fabrication according to an embodiment of the present invention.

FIG. 1C is a simplified cross-sectional diagram illustrating the substrate structure shown in FIG. 1A at a third stage of fabrication according to an embodiment of the present invention. In this embodiment, the gate of the vertical FET is formed by regrowing a III-nitride layer 130 between the vertical sidewalls of the fins. Thus, a gate interface 124 is defined on the sidewall surfaces of the fins. Although a regrown gate structure is illustrated in FIG. 1C, embodiments of the present invention are not limited to this particular FET structure and other device structures can be utilized as appropriate.

Figure 1D:
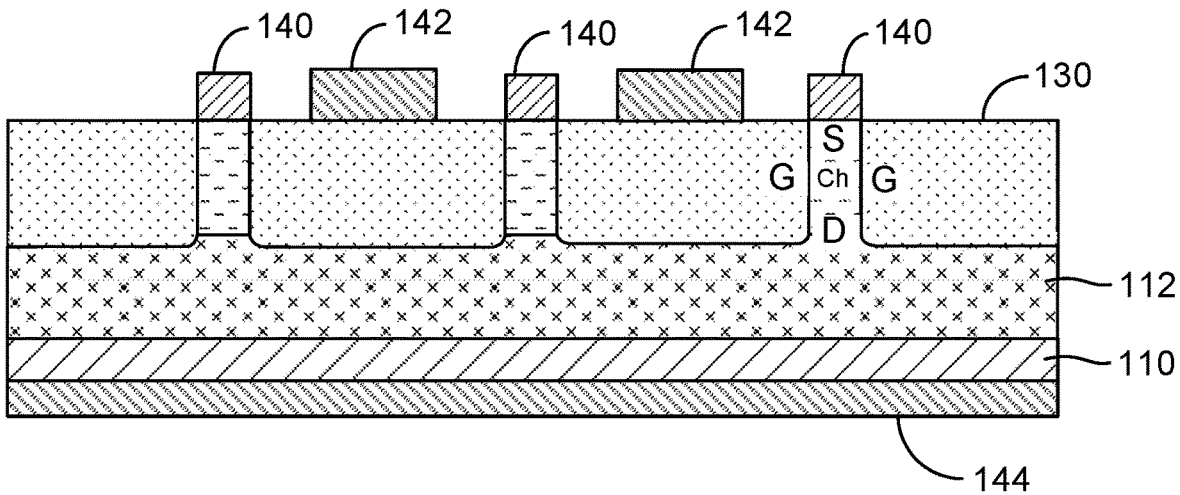
FIG. 1D is a simplified cross-sectional diagram illustrating the substrate structure shown in FIG. 1A at a fourth stage of fabrication according to an embodiment of the present invention.

FIG. 1D is a simplified cross-sectional diagram illustrating the substrate structure shown in FIG. 1A at a fourth stage of fabrication according to an embodiment of the present invention. At this stage of fabrication, the mask patterns 116 have been removed and source contacts 140 in electrical contact with source regions, gate contacts 142 in electrical contact with gate regions, and drain contact 144 in electrical contact with drain regions have been formed, thereby enabling FET operation.

Figure 2A:
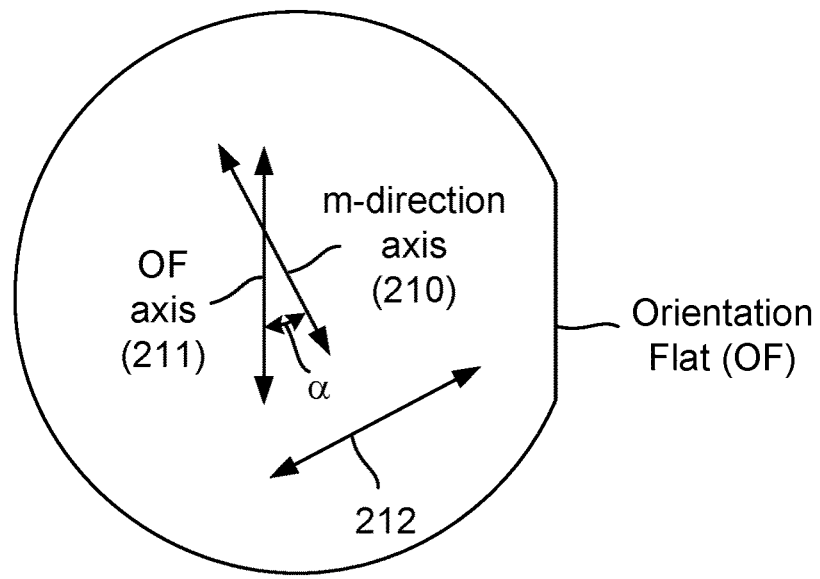
FIG. 2A is a simplified plan view of a semiconductor substrate according to an embodiment of the present invention.

FIG. 2A is a simplified plan view of a semiconductor substrate according to an embodiment of the present invention. As an example, the semiconductor substrate can be a III-N substrate, for example, a GaN substrate. An orientation flat (OF) is provided on the semiconductor substrate in order to provide alignment information utilized during device processing. In the case in which the semiconductor substrate is a GaN substrate, the OF, which is aligned with OF axis 211, is manufactured to align, within a manufacturing tolerance to an in-direction of a GaN substrate, illustrated by m-direction axis 210 in FIG. 2A. In some specifications, the manufacturing tolerance within which OF axis 211 is aligned to the in-direction axis 210 can be ±1°. Since, as described herein, alignment between the mask edge and the <1̄21̄0> directions is controlled to be within 0.3°, a manufacturing tolerance within which OF axis 211 is aligned to the m-direction axis 210 of ±1° will not enable fabrication of devices having a narrower tolerance.

As shown in FIG. 2A, the actual m-direction, which is determined using one of several crystallographic techniques is aligned with m-direction axis 210. As a result, the semiconductor substrate is characterized by a misalignment between the OF aligned with OF axis 211 and the actual m-direction, which is aligned with m-direction axis 210 by a correction factor α. The a-direction, which is orthogonal to the m-direction, is illustrated by a-direction axis 212. Accordingly, the a-direction is also misaligned by α with respect to the normal to the OF axis 211.

During lithography, if the mask is aligned to the OF, which can be misaligned with respect to the m-direction axis 210, for example, by ±1° given standard manufacturing tolerances, then the features on the mask will not be aligned with the actual crystal planes and directions of the semiconductor substrate, but with the OF. The inventors have determined that the resulting misalignment between the features on the mask, which are used in patterning the mask layer and the physical structures of the transistor, and the crystal planes and directions of the semiconductor substrate, can result in adverse performance impacts, particularly, a decrease in threshold voltage.

Figure 5:
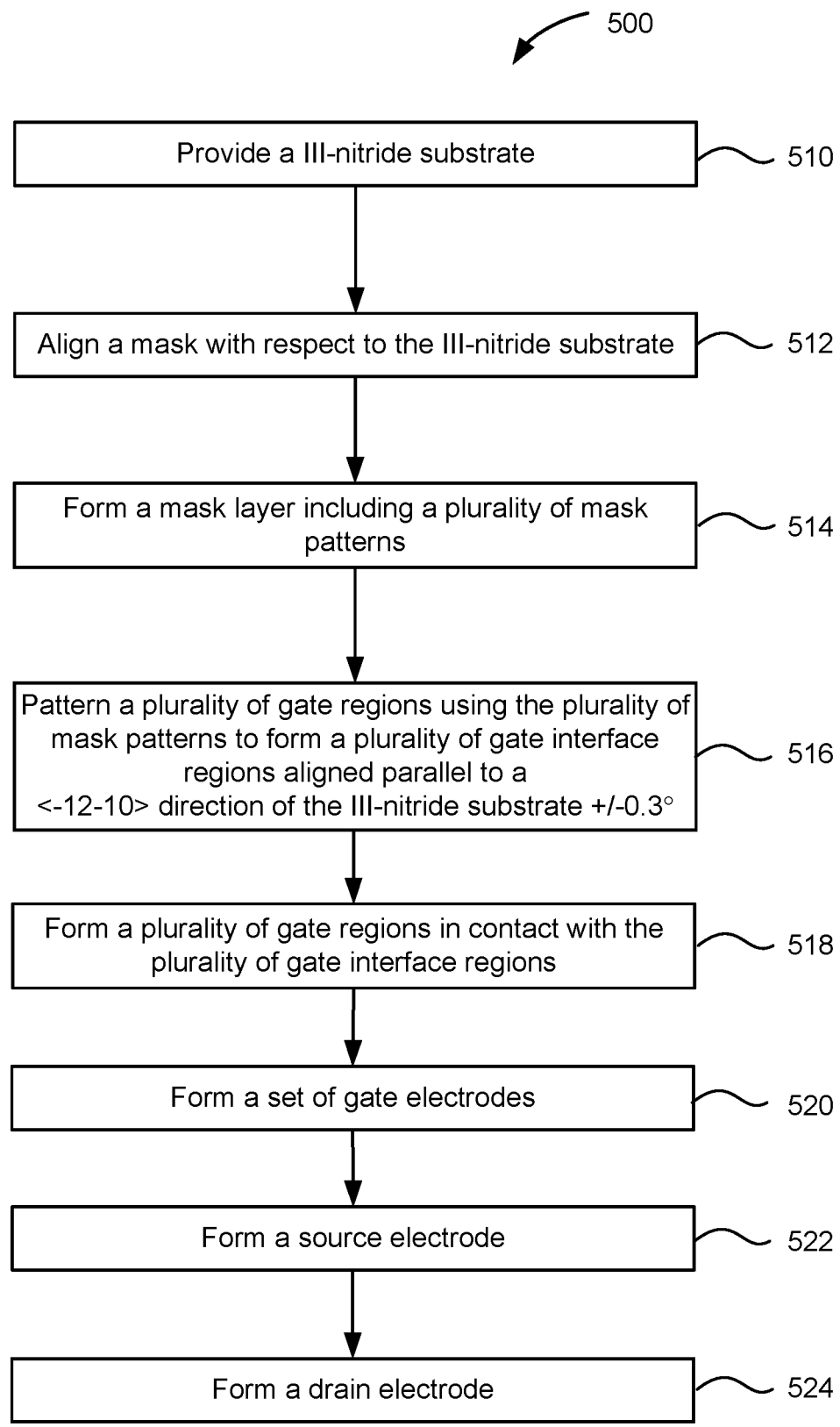
FIG. 5 is a simplified flowchart illustrating a method of fabricating a vertical transistor according to an embodiment of the present invention.

As described more fully in relation to FIG. 5, embodiments of the present invention provide a method of fabricating a vertical FET in which the gate interface region is aligned to be substantially parallel to the m-planes of the III-N (e.g., GaN) substrate. As illustrated in FIG. 2A, an alignment reference structure such as the OF can be provided on the III-nitride substrate. The orientation of the alignment reference structure can be determined to define a reference direction on the III-nitride substrate. In relation to FIG. 2A, this reference direction would be the OF axis 211 parallel to the OF. The method can also include determining one or more of the <1̄21̄0> directions of the III-nitride substrate. As illustrated in FIG. 2A, the actual a-directions (i.e., <1̄21̄0> directions), which are aligned with a-direction axis 212, are misoriented with respect to the OF normal, which is aligned perpendicular to OF axis 211. The difference between the reference direction and the <1̄21̄0> directions of the III-nitride substrate can be computed. This difference can be referred to as a correction factor.

A variety of techniques can be used to determine the orientation of the crystal with respect to the alignment reference structure (e.g., the OF). As an example, x-ray diffraction can be performed with the OF in a known orientation, and the orientation of the crystal with respect to the OF can be determined. In another implementation, the back of the substrate could be etched using an anisotropic etch, for example, using TMAH, to form pyramid structures that have crystal facets that are aligned with the crystallographic planes of the substrate. Using these pyramid structures, optical diffraction from the pyramid structures as well as the OF can be used to determine the orientation of the crystal with respect to the OF. As another example, features could be etched into the front surface of the substrate to delineate the crystallographic structure of the substrate, which can be used to determine the orientation of the crystal with respect to the OF. Moreover, anisotropic crystallographic features can be grown on the substrate that can be used in subsequent determination of the offset of the as-grown features relative to the OF. One of ordinary skill in the art would recognize many variations, modifications, and alternatives.

During mask alignment, the correction factor can be used to align the mask patterns such that the portion of the mask pattern associated with the gate interface region is parallel with the <1̄21̄0> directions of the III-nitride substrate. In some embodiments, the substrate manufacturer can provide the correction factor for the substrate, obviating the need to measure the <1̄21̄0> directions and compute the correction factor based on the orientation of the crystal with respect to the OF. During some lithography processes, the correction factor can be used by the lithography tool to align the mask to the crystal planes and/or directions of the substrate rather than to the OF. One of ordinary skill in the art would recognize many variations, modifications, and alternatives.

Thus, referring to FIG. 2A, a method of aligning a mask to a semiconductor substrate (e.g., a GaN substrate) can include computing a difference between a reference direction (e.g., OF axis 211 parallel to the OF) and a crystallographic direction (e.g., the <$\bar{1}2\bar{1}0$> directions). This difference can be referred to as a correction factor, illustrated as a in FIG. 2A. Then, using this information, the mask can be aligned to the alignment reference structure (i.e., the OF) and, thereafter, the mask can be realigned, for example, rotated by the correction factor, to align the features on the mask with the crystallographic direction (e.g., the <$\bar{1}2\bar{1}0$> directions).

Figure 2B:
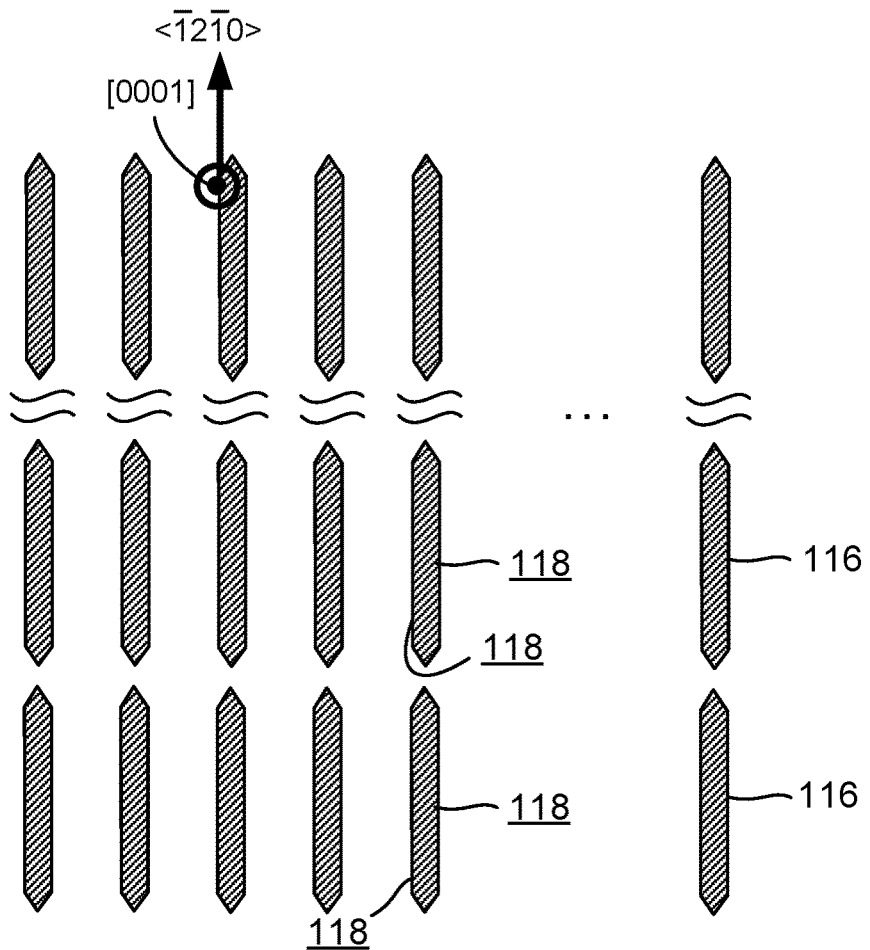
FIG. 2B is a simplified plan view of a set of mask patterns aligned with respect to a substrate plane according to an embodiment of the present invention.

FIG. 2B is a simplified plan view of a set of mask patterns aligned with respect to a substrate plane according to an embodiment of the present invention. In the plan view shown in FIG. 2B, the [0001] direction (i.e., the c-direction) is normal to the plane of the figure (i.e., the c-plane) and the mask patterns 116 are formed such that the side surfaces 118 of the mask patterns 116 are intended to be aligned with the m-planes of the GaN crystal, which are parallel to the direction and parallel to the [0001] direction. Thus, as shown in FIG. 2B, the side surfaces 118 are formed such that the orientation between the side surfaces 118 and the [$\bar{1}2\bar{1}0$] direction is aligned within ±0.3°.

As illustrated in FIG. 2B, each of the mask patterns are formed to have a hexagonal shape in plan view. Thus, all six sides of each mask pattern are intended to be aligned with one of the m-planes of the GaN crystal, with the included apex angle at each tip being 120°. As discussed in relation to FIG. 1B, although the vertical direction of the sidewall can be well-defined by the etch process, the lateral orientation of the sidewall (i.e., the alignment of the sidewall surface with respect to the horizontal direction) is dependent on the accuracy of the mask formation process and the alignment of the mask edges to one of the <$\bar{1}2\bar{1}0$> directions. Accordingly, embodiments of the present invention provide methods and systems to orient the sidewall surfaces to be substantially parallel to the m-plane, i.e., aligned with one of the <$\bar{1}2\bar{1}0$> directions.

Figure 3A:
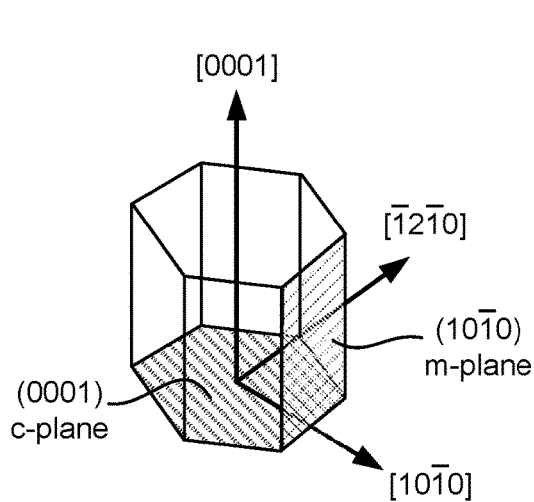
FIG. 3A is a simplified perspective diagram illustrating a hexagonal crystal structure.

FIG. 3A is a simplified perspective diagram illustrating a hexagonal crystal structure. As illustrated in FIG. 3A, the hexagonal crystal structure includes the c-plane (0001) and one m-plane (10$\bar{1}$0). The c-direction [0001] and one m-direction [10$\bar{1}$0] are also illustrated. An orthogonal a-direction [$\bar{1}2\bar{1}0$] is also illustrated. As described herein, knowledge of the orientations of the crystallographic planes and/or directions is utilized in defining device elements such that the device elements, for example, the gate interface, are aligned with the appropriate crystallographic plane and/or direction.

Figure 3B:
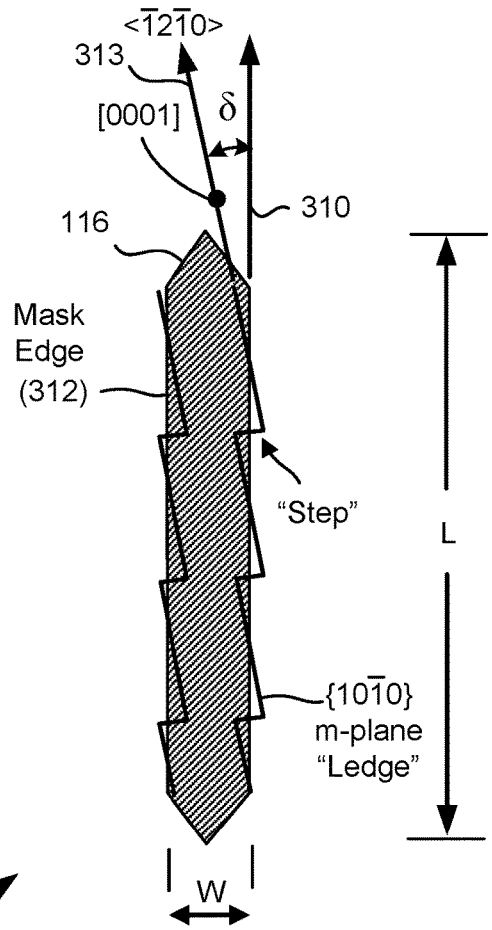
FIG. 3B is a simplified plan view of a mask pattern misaligned with respect to a substrate direction according to an embodiment of the present invention.

FIG. 3B is a simplified plan view of a mask pattern misaligned with respect to a substrate direction according to an embodiment of the present invention. In FIG. 3B, one of the mask patterns 116 discussed in relation to FIG. 2B is illustrated in reference to the crystallographic planes and directions of the GaN crystal. The c-direction [0001] is normal to the plane of the figure. As illustrated in FIG. 3B, the length L of the mask pattern 116 is measured in the direction aligned with axis 310 and the width W of the mask pattern 116 is orthogonal to the length. The height of the features that will be made using the mask pattern is measured in the direction aligned with the c-direction [0001].

As illustrated in FIG. 3B, the mask edges 312 of the mask pattern 116 are aligned with axis 310. One of the a-directions <$\bar{1}2\bar{1}0$> is aligned with axis 313, which is rotated with respect to axis 310 by the rotation error 6. Because of this rotation error, the structure that is fabricated using the mask pattern, illustrated by solid lines, includes {10$\bar{1}$0} m-plane ledges as well as steps. These features will be discussed in additional detail in relation to FIG. 3C. As illustrated, the misalignment between the mask edges 312 of the mask pattern 116 and the crystallographic planes of the semiconductor material result in performance degradation, for example, in terms of decreases in threshold voltage for transistors characterized by this misalignment between the mask edge 312, which defines the sidewalls of the FET, and the crystallographic planes of the semiconductor material.

Figure 3C:
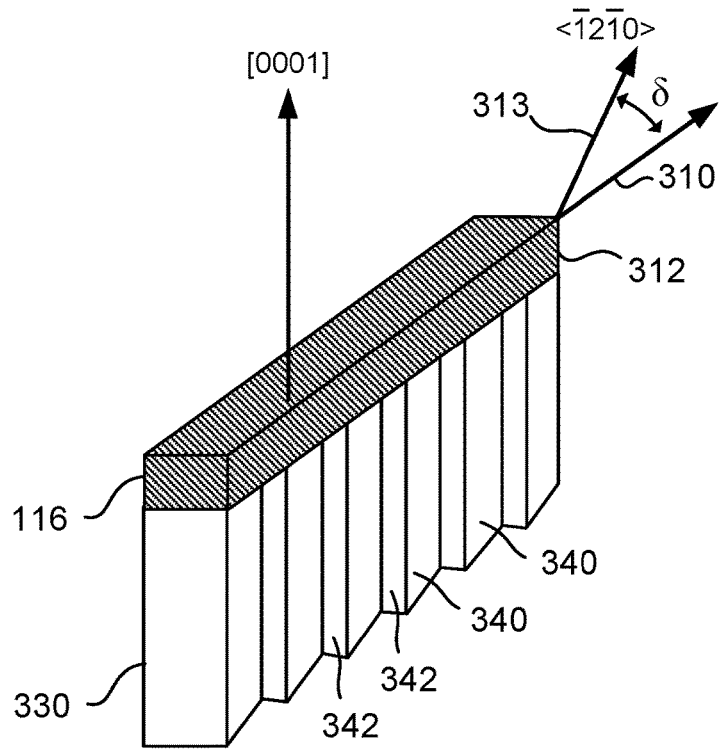
FIG. 3C is a simplified perspective view of a mask pattern misaligned with respect to a substrate direction and resulting etch surfaces according to an embodiment of the present invention.

FIG. 3C is a simplified perspective view of a mask pattern misaligned with respect to a substrate direction and resulting etch surfaces according to an embodiment of the present invention. Referring to FIG. 3C, in which the ends of the mask pattern 116 have been removed for clarity, the mask pattern 116 is shown along with a fin 330 fabricated using the mask pattern 116. Using an anisotropic etch, the shape of the mask pattern 116 should be transferred into the semiconductor material. However, if the side edges of the mask patterns, also referred to as the mask edge, is not exactly aligned to one of the <$\bar{1}2\bar{1}0$> directions, the anisotropic etch can create "ledges" 340 along the sidewall of the trench. Each of these ledges 340 is parallel to the desired [$\bar{1}2\bar{1}0$] direction and is aligned with the m-plane (10$\bar{1}$0). Thus, the etched surface of the sidewall includes (10$\bar{1}$0) m-plane ledges that are oriented at an angle δ to the mask edge and are separated by periodic steps 342, thereby producing an average lateral direction of the sidewall that generally matches the mask edge, but is non-planar at a smaller scale due to the presence of the ledges 340 and the steps 342. As discussed above, the non-uniform sidewall surface profile impacts device performance in an adverse manner, for example, as a result of reduced dopant incorporation on the sidewall growth surface due to the misalignment discussed herein.

According to embodiments of the present invention, given the impact of misalignment between the mask used in fabricating the fin sidewall surfaces and the crystallographic planes of the semiconductor material, methods and systems for aligning the mask patterns to the crystallographic planes of the semiconductor material are provided. Thus, rather than the misalignment of the mask pattern 116 with respect to the <$\bar{1}2\bar{1}0$> directions that is illustrated in FIG. 3B, according to embodiments of the present invention, the mask pattern will be aligned such that the mask edge 312 is aligned with respect to a [$\bar{1}2\bar{1}0$] direction so that, in some implementations, δ≈0. In other implementations, the mask pattern is aligned such that the mask edge 312 is aligned with respect to a [$\bar{1}2\bar{1}0$] direction so that −0.3<δ<0.3. In yet other implementations, the mask pattern is aligned such that the mask edge 312 is aligned with respect to a [$\bar{1}2\bar{1}0$] direction so that −0.15<δ<0.15. One of ordinary skill in the art would recognize many variations, modifications, and alternatives.

This high level of control over the fin sidewall orientation enables transistors made using embodiments of the present invention to maintain the threshold voltage within narrow specification ranges. In some embodiments, the vertical orientation of the fins is maintained in a direction aligned with the c-direction [0001] by use of anisotropic etching (e.g., with TMAH). The vector parallel to the c-plane lying in the plane of the sidewall is aligned to the a-direction [$\bar{1}2\bar{1}0$] within ±0.3°, ±0.15°, or the like. It should be noted that if the substrate is a miscut substrate, namely, a substrate that has a growth surface misoriented with respect to the c-plane to improve device performance, the vertical orientation of the fins will be tilted by the miscut angle with respect to the c-direction [0001], so vertical orientation alignment of the fins with the c-direction [0001] is not required by embodiments of the present invention. Additional description related to miscut substrates is provided in U.S. Pat. No. 9,368,582, the disclosure of which is hereby incorporated by reference in its entirety for all purposes.

Figure 4:
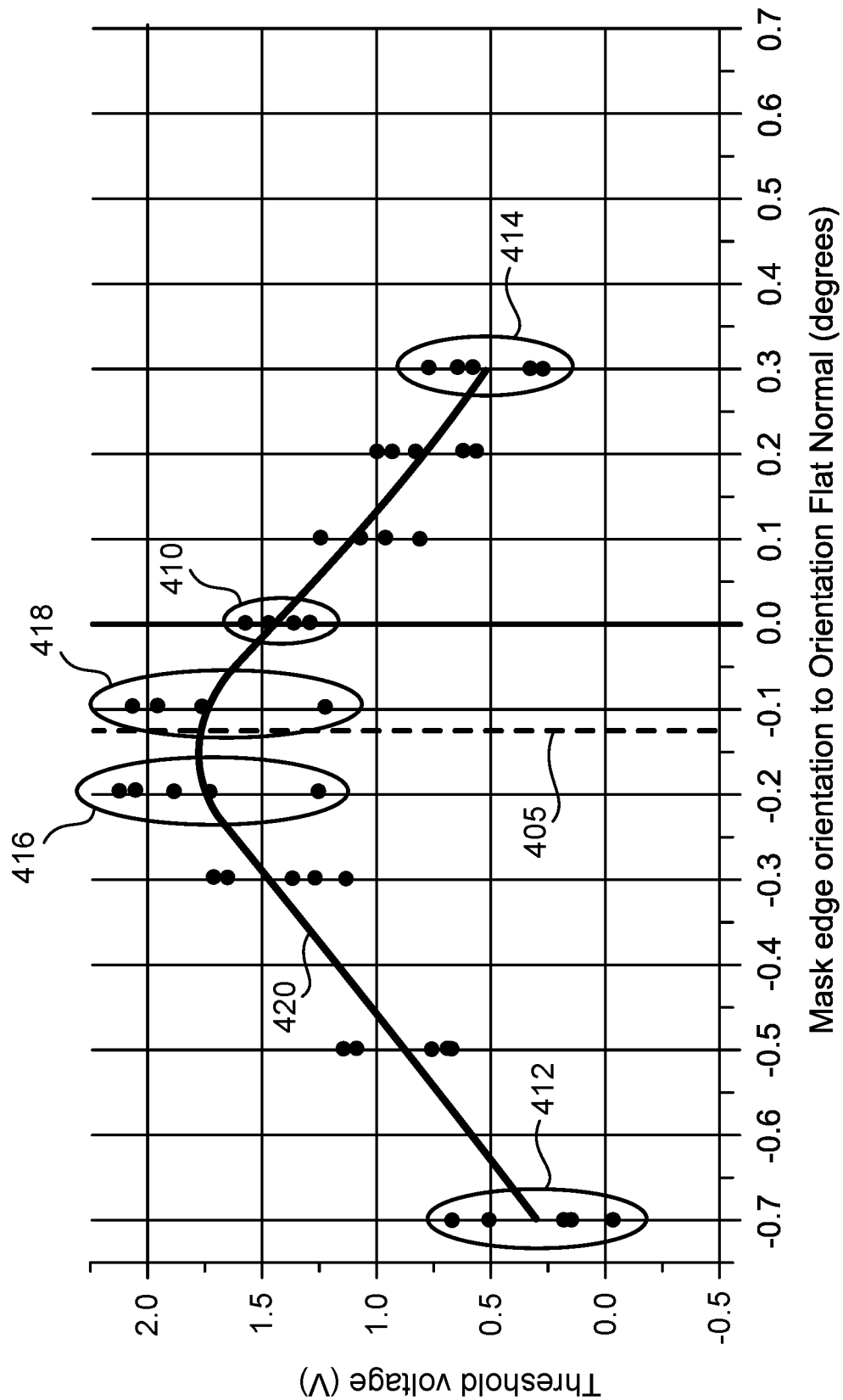
FIG. 4 is a plot illustrating variation in threshold voltage as a function of mask pattern alignment with respect to an orientation flat according to an embodiment of the present invention.

FIG. 4 is a plot illustrating variation in threshold voltage as a function of mask pattern alignment with respect to an orientation flat according to an embodiment of the present invention. As discussed above, the misorientation of the mask edge with respect to the [$\bar{1}2\bar{1}0$] direction adversely impacts the threshold voltage of the device. The inventors believe, without limiting embodiments of the present invention, that non-uniform dopant incorporation as a function of misorientation, as well as resulting morphology changes, contributes to the decrease in threshold voltage illustrated in FIG. 4. This variation in the threshold voltage for vertical fin-based JFET devices formed in GaN using regrown gates is illustrated in FIG. 4 in which the threshold voltage of the JFET decreases as the absolute value of the mask edge misorientation relative to the [$\bar{1}2\bar{1}0$] direction increases.

Referring to FIG. 4, the threshold voltage in Volts is plotted as a function of mask edge orientation with respect to the OF in degrees. Data points 410 correspond to devices fabricated with the mask edge aligned to the OF. For these data points, the mask edge was oriented with respect to the OF normal and the orientation of the mask edge with respect to the OF normal was zero. The average threshold voltage of these devices is ~1.4V. Other device runs were made with differing orientations between the mask edge and the OF normal. As an example, data points 412 correspond to devices fabricated with the mask edge oriented with respect to the OF normal by −0.7°. Data points 414 correspond to devices fabricated with the mask edge oriented with respect to the OF normal by +0.3°.

As illustrated in FIG. 4, the average threshold voltage for the various sets of devices varied from ~0.25V to ~1.75 V. Devices having a mask edge oriented with respect to the OF normal by −0.7° were characterized by an average threshold voltage of ~0.25V whereas devices having a mask edge oriented with respect to the OF normal by +0.3° were characterized by an average threshold voltage of ~0.5V. Devices fabricated with the mask edge oriented with respect to the OF normal by values between −0.7° and 0.3° were characterized by average threshold voltages between ~0.25V to ~1.75 V. Curve 420 is a curve fit to the average threshold voltage for the various sets of device data. As illustrated in FIG. 4, curve 420 is characterized by a peak threshold voltage of ~1.75V. This peak threshold voltage corresponds to devices that would have a mask edge to OF normal orientation value between −0.2° and −0.1°.

Measurement of the crystallographic structure of the GaN substrate resulted in a measurement of an orientation of the OF normal with respect to the [$\bar{1}2\bar{1}0$] direction of −0.117°, illustrated in FIG. 4 by orientation value 405. As shown in FIG. 4, this value of orientation between the mask edge and the OF normal corresponds to the devices with the highest threshold voltage, namely devices having a mask edge oriented with respect to the OF normal by −0.2° (i.e., data set 416) and devices having a mask edge oriented with respect to the OF normal by −0.1° (i.e., data set 418). Thus, for this particular semiconductor substrate, in order to fabricate devices characterized by the highest threshold voltage, the mask edge should be oriented −0.117° with respect to the OF normal, which will align the mask edge with the [$\bar{1}2\bar{1}0$] direction and result in the fin sidewall being parallel to the m-plane of the GaN substrate.

Thus, embodiments of the present invention fabricate vertical device structures with the sidewall lateral direction being oriented within a specific tolerance with respect to one of the <$\bar{1}2\bar{1}0$> directions in order to control the electrical parameters of the vertical FET. Although the data shown in FIG. 4 was obtained using a regrown-gate JFET device, the effects of misorientation of the sidewall lateral direction will impact other vertical-gate JFETs and MOSFETs.

FIG. 5 is a simplified flowchart illustrating a method of fabricating a vertical transistor according to an embodiment of the present invention. As discussed in FIG. 5, the angular orientation of a reference alignment feature (e.g., an OF) to the substrate crystallographic planes can be measured or otherwise obtained and used during lithography to align the features on the mask with the substrate crystallographic planes within a predetermined range. Referring to FIG. 5, method 500 illustrates a method of fabricating a FET on a III-nitride substrate. The method includes providing the III-nitride substrate (510).

The method also includes aligning a mask with respect to the III-nitride substrate (512). In some embodiments, a reference alignment feature such as an OF can be present on the III-nitride substrate and the reference alignment feature can be utilized during alignment of the mask with respect to III-nitride substrate. As discussed herein, there are multiple techniques that can be used to determine the orientation of the crystallographic planes and directions of the III-nitride substrate and offsets to these crystallographic planes and directions. These techniques include x-ray diffraction, optical diffraction, optical comparison with a feature that has been anisotropically etched to reveal the crystallographic planes of the III-nitride substrate, comparison with a feature anisotropically grown to reveal crystallographic planes of the III-nitride substrate, and the like.

Aligning the mask with respect to the III-nitride substrate can be performed by determining an orientation of an alignment reference structure of the III-nitride substrate and determining the <$\bar{1}2\bar{1}0$> directions of the III-nitride substrate. In this case, the alignment reference structure defines a reference direction on the III-nitride substrate. This method of aligning the mask with respect to the III-nitride substrate can also include computing a difference between the reference direction and the <$\bar{1}2\bar{1}0$> directions and aligning the feature of one or more of the plurality of mask patterns based on the difference. As an alternative, this method of aligning the mask with respect to the III-nitride substrate can include computing a difference between the reference direction and the <$\bar{1}2\bar{1}0$> directions, aligning the mask to the alignment reference structure, and, thereafter, re-aligning the mask based on the difference. As an example, determining the <$\bar{1}2\bar{1}0$> directions of the III-nitride substrate can include analyzing the III-nitride substrate using at least one of an x-ray diffraction technique or an optical diffraction technique.

The method further includes forming a mask layer including a plurality of mask patterns (514) and patterning a plurality of gate regions using the plurality of mask patterns to form a plurality of gate interface regions aligned parallel to one of the <$\bar{1}2\bar{1}0$> directions of the III-nitride substrate ±0.3° (516). Each mask pattern of the plurality of mask patterns can include a feature aligned parallel to the [$\bar{1}2\bar{1}0$] direction of the III-nitride substrate ±0.3°.

The method also includes forming a plurality of gate regions in contact with the plurality of gate interface regions (518), forming a set of gate electrodes (520), forming a source electrode (522), and forming a drain electrode (524). In an embodiment, forming the drain electrode can include forming a back-side metal electrode on the III-nitride substrate.

It should be appreciated that the specific steps illustrated in FIG. 5 provide a particular method of fabricating a vertical transistor, for example, a FET, according to an embodiment of the present invention. Other sequences of steps may also be performed according to alternative embodiments. For example, alternative embodiments of the present invention may perform the steps outlined above in a different order. Moreover, the individual steps illustrated in FIG. 5 may include multiple sub-steps that may be performed in various sequences as appropriate to the individual step. Furthermore, additional steps may be added or removed depending on the particular applications. One of ordinary skill in the art would recognize many variations, modifications, and alternatives.

While various embodiments of the invention have been described above, it should be understood that they have been presented by way of example only, and not by way of limitation. Likewise, the various diagrams may depict an example architectural or other configuration for the disclosure, which is done to aid in understanding the features and functionality that can be included in the disclosure. The disclosure is not restricted to the illustrated example architectures or configurations, but can be implemented using a variety of alternative architectures and configurations. Additionally, although the disclosure is described above in terms of various exemplary embodiments and implementations, it should be understood that the various features and functionality described in one or more of the individual embodiments are not limited in their applicability to the particular embodiment with which they are described. They instead can be applied alone or in some combination, to one or more of the other embodiments of the disclosure, whether or not such embodiments are described, and whether or not such features are presented as being a part of a described embodiment. Thus the breadth and scope of the present disclosure should not be limited by any of the above-described exemplary embodiments.

It will be appreciated that, for clarity purposes, the above description has described embodiments of the invention with reference to different functional units and processors. However, it will be apparent that any suitable distribution of functionality between different functional units, processors or domains may be used without detracting from the invention. For example, functionality illustrated to be performed by separate processors or controllers may be performed by the same processor or controller. Hence, references to specific functional units are only to be seen as references to suitable means for providing the described functionality, rather than indicative of a strict logical or physical structure or organization.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; and adjectives such as "conventional," "traditional," "normal," "standard," "known", and terms of similar meaning, should not be construed as limiting the item described to a given time period, or to an item available as of a given time. But instead these terms should be read to encompass conventional, traditional, normal, or standard technologies that may be available, known now, or at any time in the future. Likewise, a group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the disclosure may be described or claimed in the singular, the plural is contemplated to be within the scope thereof unless limitation to the singular is explicitly stated. The presence of broadening words and phrases such as "one or more," "at least," "but not limited to", or other like phrases in some instances shall not be read to mean that the narrower case is intended or required in instances where such broadening phrases may be absent.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of fabricating a field effect transistor (FET) on a III-nitride substrate, the method comprising:
   providing the III-nitride substrate;
   aligning a mask with respect to the III-nitride substrate;
   forming a mask layer including a plurality of mask patterns;
   providing a plurality of gate interface regions aligned parallel to one of the <$\bar{1}2\bar{1}0$> directions of the III-nitride substrate ±0.3° and adjoining a channel region extending between a source region and a drain region;
   forming a plurality of gate regions in contact with the plurality of gate interface regions;
   forming a gate electrode coupled to the plurality of gate regions;
   forming a source electrode coupled to the source region; and
   forming a drain electrode coupled to the drain region.

2. The method of claim 1 wherein aligning the mask with respect to the III-nitride substrate comprises:
   determining an orientation of an alignment reference structure of the III-nitride substrate, wherein the alignment reference structure defines a reference direction on the III-nitride substrate; and
   determining the <$\bar{1}2\bar{1}0$> directions of the III-nitride substrate.

3. The method of claim 2 further comprising:
   computing a difference between the reference direction and the <$\bar{1}2\bar{1}0$> directions; and
   aligning a feature of one or more of the plurality of mask patterns based on the difference.

4. The method of claim 2 further comprising:
   computing a difference between the reference direction and the <$\bar{1}2\bar{1}0$> directions;
   aligning the mask to the alignment reference structure; and
   thereafter, re-aligning the mask based on the difference.

5. The method of claim 2 wherein determining the <$\bar{1}2\bar{1}0$> directions of the III-nitride substrate comprises analyzing the III-nitride substrate using at least one of an x-ray diffraction technique or an optical diffraction technique.

6. The method of claim 1 wherein each mask pattern of the plurality of mask patterns includes a feature aligned parallel to one of the <$\bar{1}2\bar{1}0$> directions of the III-nitride substrate ±0.3°.

7. The method of claim 1 wherein forming the drain electrode comprises forming a back-side metal electrode on the III-nitride substrate.

8. The method of claim 1, wherein:
forming the plurality of gate regions comprises epitaxially regrowing the plurality of gate regions.

9. A method of fabricating a field effect transistor (FET) on a III-nitride substrate, the method comprising:
providing the III-nitride substrate comprising an alignment reference structure, wherein the alignment reference structure defines a reference direction on the III-nitride substrate;
determining <$\bar{1}2\bar{1}0$> directions of the III-nitride substrate;
computing a difference between the reference direction and the <$\bar{1}2\bar{1}0$> directions to define a correction factor;
aligning a mask with respect to the III-nitride substrate using correction factor;
forming a mask layer including a plurality of mask patterns;
providing a plurality of gate interface regions aligned parallel to one of the <$\bar{1}2\bar{1}0$> directions of the III-nitride substrate ±0.3° and defining a channel region extending between a source region and a drain region;
forming a plurality of gate regions in contact with the plurality of gate interface regions;
forming a gate electrode coupled to the plurality of gate regions;
forming a source electrode coupled to the source region; and
forming a drain electrode coupled to the drain region.

10. The method of claim 9 wherein:
each mask pattern of the plurality of mask patterns includes a feature aligned parallel to one of the <$\bar{1}2\bar{1}0$> directions of the III-nitride substrate ±0.3°.

11. The method of claim 9, wherein:
forming the plurality of gate regions comprises epitaxially regrowing the plurality of gate regions.

12. The method of claim 9, wherein:
providing the plurality of gate interface regions comprises providing a fin defining the channel region vertically extending between the source region and the drain region.

13. The method of claim 9, wherein aligning the mask comprises:
aligning the mask to the alignment reference structure; and
thereafter, re-aligning the mask based on the correction factor.

14. The method of claim 9, wherein:
providing the III-nitride substrate comprises providing the alignment reference structure comprising an orientation flat.

* * * * *